United States Patent [19]

Alden et al.

[11] Patent Number: 5,646,816
[45] Date of Patent: Jul. 8, 1997

[54] IDENTIFICATION ICON INDICIA FOR PLUG-IN UNITS OF A POWER DISTRIBUTION SYSTEM

[75] Inventors: Tor Andrew Alden, Bernardsville, N.J.; Edward Clark Fontana; Sonja K. Somdahl, both of Rockwall, Tex.

[73] Assignee: Lucent Technologies Inc., Murray Hill, N.J.

[21] Appl. No.: 210,212

[22] Filed: Mar. 18, 1994

[51] Int. Cl.$^6$ .................................................. H02B 1/26
[52] U.S. Cl. .......................... 361/622; 361/725; 361/728
[58] Field of Search ................................. 361/622, 725, 361/728, 730, 832; 340/584, 693; 439/61, 341, 709

[56] References Cited

U.S. PATENT DOCUMENTS

| | | | |
|---|---|---|---|
| 3,394,287 | 7/1968 | Zitzmann et al. | 361/832 |
| 4,738,632 | 4/1988 | Schmidt et al. | 439/341 |
| 5,043,847 | 8/1991 | Deinhardt et al. | 361/395 |
| 5,095,403 | 3/1992 | Pin et al. | 361/725 |
| 5,253,140 | 10/1993 | Inoue et al. | 361/728 |

*Primary Examiner*—Gregory D. Thompson
*Attorney, Agent, or Firm*—Alfred G. Steinmetz

[57] ABSTRACT

Icon indicia are provided on input, output and plug-in power processing units to permit proper matching of plug-in units with each other and with the input and output power processing units in a power distribution system. The indicia are in a co-ordinated matrix format with input icons on a designated chroma background to identify input voltages and output icons on a second designated chroma background to identify output voltages. Icons and background chroma on the plug-in power processing units are coordinated with related icons and background chroma at the same matrix position on other plug-in units and/or the input and output units to assure the compatibility of all the units. A craftsman inserting a plug-in unit onto a shelf of the power chassis need merely compare the unit's icon and chroma background indicia with the input, output, or other unit's icons and associated chroma background indicia to be assured of inserting the correct plug-in unit into the particular shelf.

13 Claims, 3 Drawing Sheets

5,646,816

IDENTIFICATION ICON INDICIA FOR PLUG-IN UNITS OF A POWER DISTRIBUTION SYSTEM

FIELD OF THE INVENTION

This invention relates to a power distribution system having a plurality of differing plug-in units for processing power and in particular to icon indicia attached to the plug-in units to facilitate insertion into plug-in stations included in a support chassis connected to a back plane of the power distribution system.

BACKGROUND OF THE INVENTION

Power distribution systems normally can accommodate a variety of plug-in units which plug into various back planes and enable the distribution of various voltage and current levels of power. Given a particular power distribution scheme, the plug-in power units used must function in harmony with one another. This means that they must be properly selected for addition to the backplane. These selections are normally made by a crafts person who is familiar with the requirements of the plug-in units. It is not uncommon for an incorrect unit to be plugged in due to time and other pressures causing plug-in unit preselection to be made incorrectly. This may be due to confusing markings on the plug-in units or failure to understand the proper unit needed for a particular power distribution scheme.

SUMMARY OF THE INVENTION

Therefore, icon and background chroma (i.e. color) indicia are provided to facilitate proper matching of plug-in units in a power processing system.

In an illustrative embodiment, the indicia are in a coordinated matrix format with unique graphical icons on a first chroma background to identify the input voltage and/or current, and further unique graphical icons on a second chroma background to identify the output voltage and/or current. Indicia on plug-in units are coordinated with related indicia on other units to assure the compatibility of all units within the power processing system.

A craftsperson inserting a unit into a power distribution system need merely compare the unit's icon and chroma indicia with the indicia of adjacent units to be assured of inserting the correct plug-in unit.

DETAILED DESCRIPTION

Figure 1:
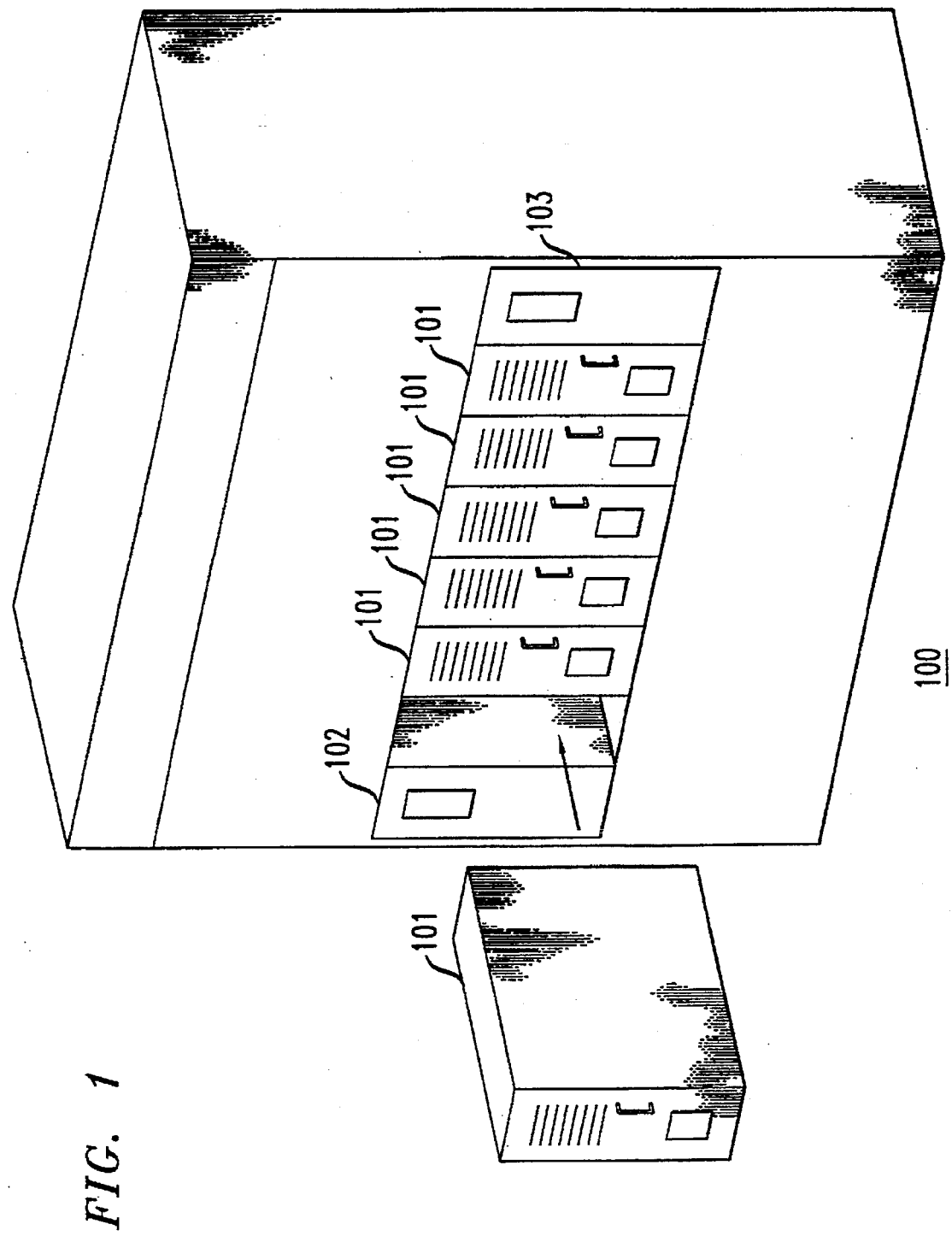
FIG. 1 is a pictorial schematic of a power system cabinet including a plurality of plug-in units which operate in concert to process power.

A power processing system chassis or cabinet 100 as shown in the FIG. 1 includes a plurality of power processing units 101, 102, 103 which slide into a shelf of the cabinet and connect to a back plane at the rear of the shelf. Power processing units 102 and 103 at the end of the shelf provide power processing and inter connection to a power source and to equipment to be powered. One of the plug-in power processing units 101 is shown prior to being plugged into the shelf and consequent connection to the backplane. The back plane electrically connects the plug-in units 101 into the electrical system between an input power processing unit and an output power processing unit 103, whereby the plug-in power processing units 101 are operative to provide processing of power between the input power processing unit 102 and the output power processing unit 103. As such, the plug-in power processing units 101 must be compatible with the electrical specifications of the power processing units 102 and 103 at the opposing ends of the shelves.

To insure compatibility in selection of the plug-in power processing units 101 to other plug-in units and to the end input and output power processing units 102, 103, all units are marked with indicia by way of icons and background chroma, associated with the icon, that insure that craft personal select the proper plug-in units to place on the shelf of the chassis. Each input power processing unit 102 and output power processing unit 103 has identifying icon and background chroma indicia on the labels 112 and 113, respectively, while each of the plug-in power processing units 101 has a label 111 that includes identifying icons and background chroma indicia.

Figure 2:
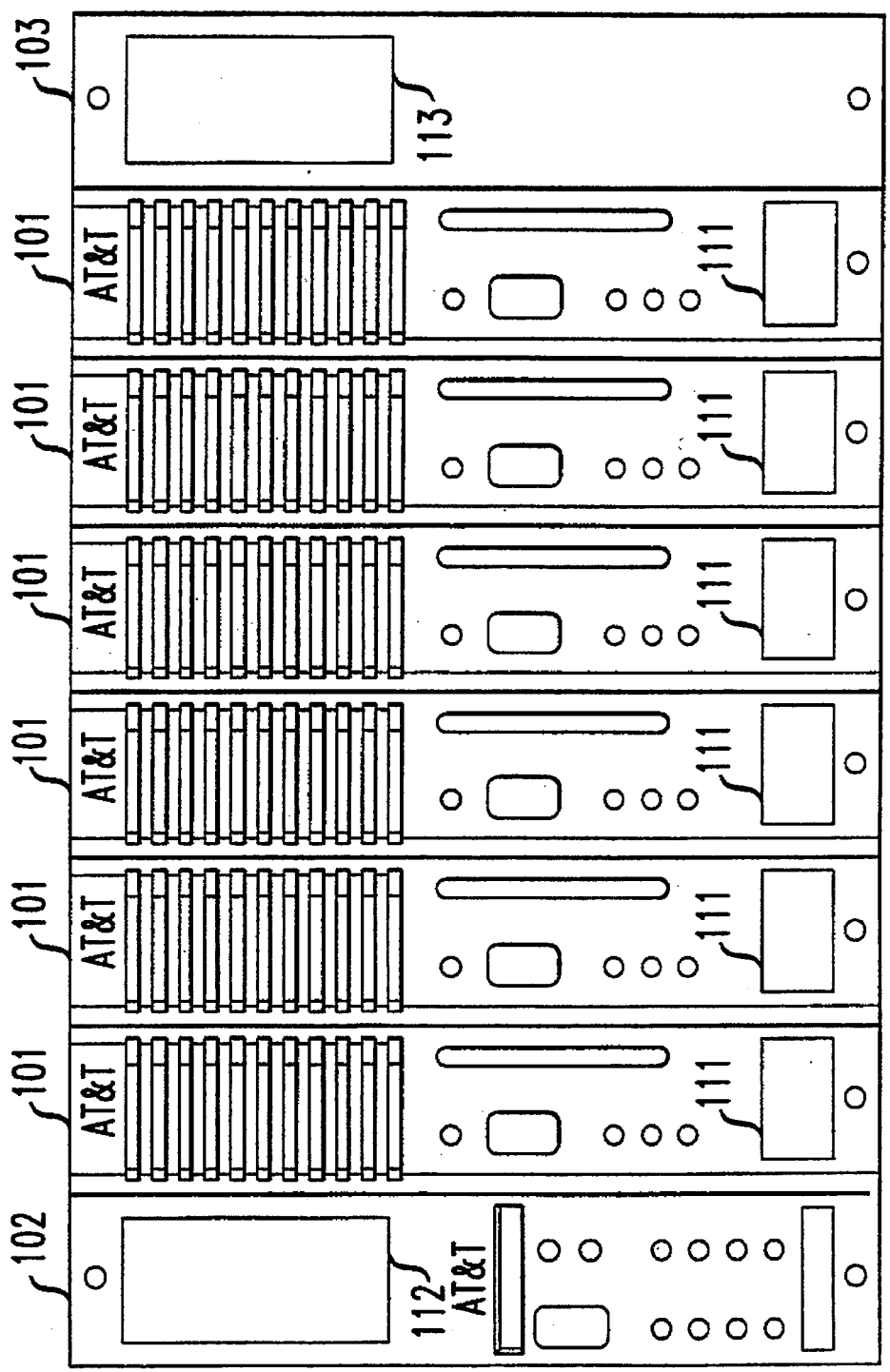
FIG. 2 is a frontal view of one of the shelves of the cabinet of FIG. 1 showing the faces of the plug-in units and the input and output units of the shelf.

The nature of the indicia marking is illustrated in the FIG. 2 which depicts a frontal view of the shelf of FIG. 1 and the individual units with the labels and associated indicia. Each label is comprised of at least an icon, a background chroma having a distinct frequency of reflected light, and alphanumeric information that provides an operational designation of the unit. The input power processing unit 102 has an identification label 112 that identifies its purpose and power/voltage ratings. The output power processing unit 103 similarly has an identification label that identifies its purpose and power/voltage ratings power processing. Each of the plug-in units 101 connects to a backplane in the power cabinet 100 and operates to process power received from the input power processing unit 102 and deliver the processed power to the output power processing unit 103.

Figure 5:
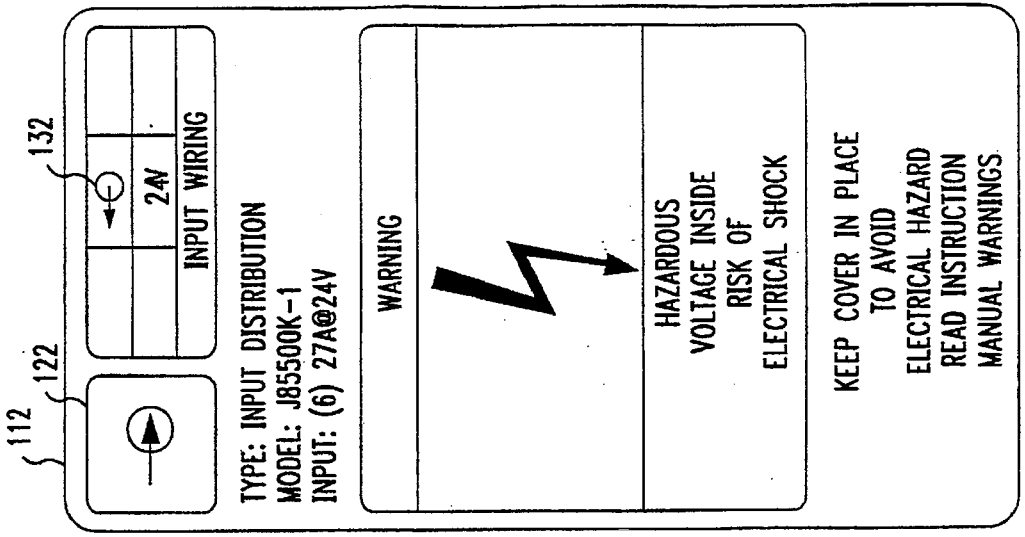
FIG. 5 is a label for an input unit of the power system cabinet.
Figure 4:
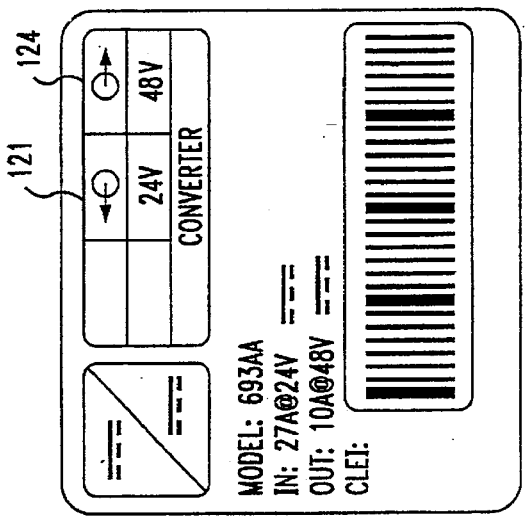
FIG. 4 is a label for a plug-in power processing unit for insertion on the shelf of the power system cabinet.
Figure 3:
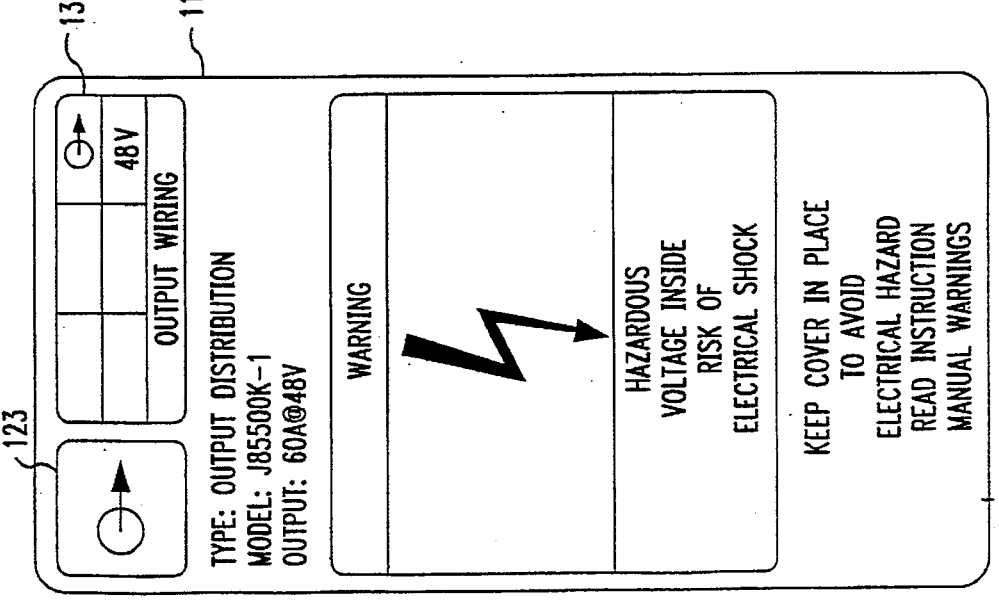
FIG. 3 is a label for an output unit of the power system cabinet.

Exemplary labels are shown in detail in the FIGS. 3, 4 and 5. The label 112 of the input power unit 102 is shown in the FIG. 5. An exemplary output power unit 103 label 113 is shown in FIG. 3 and an exemplary label 111 for a plug-in power processing unit 101 is shown in the FIG. 4.

An exemplary input power processing unit 102 label 112, shown in FIG. 5, includes an input icon 122 identifying it as an input circuit. Associated with the icon 122 is a matrix of information in which the icon is replicated as part of a matrix tabular format which includes the icon 132 on a background of a first chroma with a first radiant energy frequency (i.e. color) in one of the matrix positions. Immediately below the icon 132 is a designation of the input voltage and below that the designation "input wiring."

An exemplary output power processing unit 103 label 113, shown in FIG. 3, includes an output icon 123 identifying it as an output circuit. Associated with the icon 123 is a matrix of information in which the icon is replicated as part of a tabular matrix format which includes the icon 133 on a background of a second chroma with a second radiant energy frequency (i.e. second color) in one of the matrix positions. Immediately below the icon 133 is a designation of the output voltage and below that the designation "output wiring."

An exemplary plug-in power processing unit 101 label as shown in the FIG. 4 includes the designation "converter" in a matrix setting. Above it on the left is an input icon 121, on a chroma background keyed to the input voltage unit's rating and below it the numerical voltage rating. The input icon 121 is on the left, as is the input unit 102 as shown in FIG. 2. An output icon 124 is positioned to the right, as is the output unit 103 as shown in the FIG. 2, and below it is the numerical output voltage rating for the plug-in converter unit to which the icon 124 chroma background is keyed. As is apparent, units may be properly matched by reference to identical icon designations in identical matrix positions, by reference to identical chroma background in identical matrix positions, by comparison of numerical designations, or by combinations of the above. The specific position of indicia in the matrix matches the same indicia in the matrix of another unit to which it is compatible. In the matter of neutral back ground chroma in a specific position, the unit is preferably compatible with another unit having any chroma in that position.

A craftsman inserting units onto a shelf of the power housing need merely compare the common icon designations and/or related chroma background of a selected unit 102, output unit 103, or other unit's with the input and output unit icons and associated background chroma to be assured of inserting the correct plug-in unit into the particular shelf.

We claim:

1. A power plant, comprising:

a supporting infrastructure including a shelf for accepting a plurality of modular power processing circuits;

an input distribution unit;

an output distribution unit;

a plurality of intermediate power processing units arranged in a linear series and electrically connected intermediate the input distribution unit and the output distribution unit in order to process power supplied from the input distribution unit and deliver power to the output distribution unit;

the input distribution unit including means for accepting power from a power source and further including a first identification indicia providing an indication of an output voltage supplied to the plurality of intermediate power processing units by a label having a first radiant energy frequency visually displaying a first color in a first specific matrix position;

the output distribution unit including means for distributing power to a load and further including a second identification indicia providing an indication of an appropriate input voltage to be supplied to it by the plurality of intermediate power processing units by a label having a second radiant energy frequency visually displaying a second color in a second specific matrix position;

identification indicia associated with each of the intermediate power processing units, including;

a third identification indicia providing an indication of an acceptable input voltage accepted from the input distribution unit by including the first radiant energy frequency visually displaying the first color in the first specific matrix position, wherein a match between the voltage from the input distribution unit and the acceptable input voltage is indicated by an identity of the radiant energy frequency displayed; and the third identification indicia providing an indication of an output voltage of the intermediate power processing unit supplied to the output distribution unit by including the second radiant energy frequency visually displaying the second color in the second specific matrix position, wherein a match between the output voltage of the intermediate distribution unit and a voltage acceptable to the output distribution unit is indicated by an identity of the radiant energy frequency.

2. A power plant as recited in claim 1, further comprising;

a first icon associated with the acceptable input voltage for each of said plurality of intermediate processing units and appearing on the first and third identification indicia and a second icon associated with the voltage acceptable to the output distribution unit and appearing on the second and third identification indicia.

3. An identification scheme for enabling proper matching of the electrical specifications of a plurality of plug-in power processing units in a power chassis, including:

indicia affixed to each of said plug-in power processing units, said indicia displayed in a coordinated matrix format with an input icon on a first designated chroma background to identify input voltages and an output icon on a second designated chroma background to identify output voltages, whereby comparison of said indicia on each of said plug-in power processing units with said indicia on adjacent ones of said plug-in power processing units facilitates proper selection of a compatible plug-in power processing unit.

4. An identification scheme for enabling proper electrical specification matching of plug-in power units to an input power unit and an output power unit as claimed in claim 3;

the input icon comprising an arrow entering a circle and the output icon comprising an arrow emerging from a circle.

5. An identification system for selecting a compatible plug-in power processing unit for use in a power plant system having an input power processing unit and an output power processing unit, comprising:

a label attached to each of said power processing units;

compatibility matrix on each of said labels; and indicia within a first position in each of said compatibility matrix designating the compatibility of said plug-in power processing unit with said input unit and indicia within a second position in each of said compatibility matrix designating the compatibility of said plug-in power processing unit with said output unit, said compatibility being designated by common indicia within each of said first and second positions in each of said compatibility matrix on each of said power processing units.

6. An identification system for selecting compatible components for use in a power plant system having a plurality of power processing components, comprising:

a label attached to each of said power processing components;

a compatibility matrix on each of said labels; and indicia within each of said compatibility matrices designating operational characteristics of said power processing components, whereby said compatible components are easily selected by comparison of said indicia within like positions of each of said compatibility matrices.

7. The identification system as recited in claim 5 wherein said indicia is a graphical icon or chroma.

8. The identification system as recited in claim 6 wherein said indicia is a graphical icon or chroma.

9. A power chassis having a plurality of plug-in power processing units, comprising:

indicia affixed to each of said plug-in power processing units, said indicia displayed in a coordinated matrix format with an input icon on a first designated chroma background to identify input voltages of said plug-in power processing units and an output icon on a second designated chroma background to identify output voltages of said plug-in power processing units, whereby comparison of said indicia on one of each of said plug-in power processing units with said indicia on adjacent ones of said plug-in power processing units facilitates proper selection of a compatible plug-in power processing unit.

10. A power processing system having an input power processing unit, an output power processing unit, and a plurality of slots for receiving plug-in power processing units, said power processing system comprising:

a label attached to each of said power processing units;

a compatibility matrix on each of said labels; and indicia within a first position in each of said compatibility matrices designating the compatibility of said plug-in power processing unit with said input unit and indicia within a second position in each of said compatibility matrices designating the compatibility of said plug-in power processing unit with said output unit, whereby the compatibility of each of said power processing units is designated by common indicia within each of said first and second positions in each of said compatibility matrices on each of said power processing units.

11. The power processing system as recited in claim 10 wherein said indicia is a graphical icon or chroma.

12. A power plant employing an identification system for selecting one or more compatible power processing components for use in said power plant, said power plant comprising:

a label attached to each of said power processing components;

a compatibility matrix on each of said labels; and indicia within each of said compatibility matrices designating operational characteristics of said power processing components, whereby said compatible power processing components are easily selected by comparison of said indicia within like positions of each of said compatibility matrices.

13. The power plant as recited in claim 12 wherein said indicia is a graphical icon or chroma.

* * * * *